United States Patent [19]

Minami

[11] Patent Number: 4,492,958
[45] Date of Patent: Jan. 8, 1985

[54] DEVICE FOR CONTROLLING AND DISPLAYING THE FUNCTIONS OF AN ELECTRIC OR ELECTRONIC APPARATUS

[75] Inventor: Eiji Minami, Osaka, Japan

[73] Assignee: Matsushita Electric Industrial Co., Ltd., Kadoma, Japan

[21] Appl. No.: 368,842

[22] Filed: Apr. 15, 1982

[30] Foreign Application Priority Data

Apr. 22, 1981 [JP] Japan ................. 56-61605
May 13, 1981 [JP] Japan ................. 56-71701
Jul. 30, 1981 [JP] Japan ................. 56-120322

[51] Int. Cl.³ .................. H04Q 9/00; G08B 5/36
[52] U.S. Cl. .................. 340/825.25; 340/365 C; 340/712
[58] Field of Search .......... 340/825.25, 365 C, 712

[56] References Cited

U.S. PATENT DOCUMENTS

| | | | |
|---|---|---|---|
| 4,110,749 | 8/1978 | Janko et al. | 340/712 |
| 4,186,392 | 1/1980 | Holz | 340/365 C |
| 4,194,196 | 3/1980 | Mohiuddin | 340/365 C |
| 4,263,659 | 4/1981 | Hirata et al. | 340/365 C |
| 4,290,061 | 9/1981 | Serrano | 340/712 |
| 4,334,219 | 6/1982 | Paülus et al. | 340/365 C |
| 4,374,381 | 2/1983 | Ng et al. | 340/365 C |

Primary Examiner—Donald J. Yusko

[57] ABSTRACT

An operation control device is disclosed for initiating operations of electric or electronic apparatus such as microwave ovens, radio receivers and tape recorders. The device includes an operation section having a housing made of non-conductive material and an operation electrode accommodated in the housing, and a detection circuit which detects whether an external stimulus, such as a finger of a user, is touching the outside surface of the housing, thereby producing an activation signal. When an activation signal is detected, the detection circuit produces an operation order signal to cause a control circuit to control operation of a corresponding electric or electronic apparatus.

12 Claims, 10 Drawing Figures a.)    b.)    c.)

DEVICE FOR CONTROLLING AND DISPLAYING THE FUNCTIONS OF AN ELECTRIC OR ELECTRONIC APPARATUS

DESCRIPTION OF THE INVENTION

This invention relates generally to an operation control device for an electric or an electronic apparatus and more particularly to such a device for initiating operations of an electric or electronic apparatus for lightly touching an operation section thereof.

In the past, electric or electronic apparatus used switches having mechanical contacts, namely mechanical switches, as operation control devices for initiating operations thereof. Such mechanical switches, however, had some disadvantages, among which are: (1) malfunction sometimes occurs because of chattering of contacts upon depression of a switch; (2) a mechanical switch is readily affected by environmental conditions such as humidity (for example, normally-opened contacts of a switch may be short-circuited in a high-humidity atmosphere) and thus, would not function properly; (3) function of a mechanical switch deteriorates over time because of corrosion of the contacts; and (4) the dimensions of a mechanical switch cannot be reduced much in size and thickness and, therefore, it is not suitable for use in a very small-size apparatus.

In an attempt to eliminate these disadvantages, electronic switches have been used instead of mechanical switches. Electronic switches generally include an operation electrode and a switching circuit consisting of, for example, transistors. When a user touches an operation electrode with his finger, hum noise, for example, is induced on such an operation electrode which causes operation of the switching circuit. These electronic switches eliminate some of the disadvantages listed above of mechanical switches. However, even in such an electronic switch, since an operation electrode is exposed to the atmosphere, an operation electrode is affected by environmental conditions. For example, if an operation electrode and finger of a user are dry, the switching circuit may not be triggered even though the electrode has been touched. There is another kind of electronic switch which includes two operation electrodes disposed proximate to each other. In this second type of electronic switch, when a user touches both of the operation electrodes with his finger, the operation electrodes are electrically connected through the finger and a switching circuit is triggered to operate. However, this second type of electronic switch also has the same disadvantages as the first type of electronic switch since two operation electrodes are exposed to atmosphere in the same manner and may be adversely affected by environmental conditions.

The present invention, therefore, has as its principal object to provide an improved operation control device which eliminates the disadvantages of conventional operation control devices using mechanical or electronic switches.

Another object of this invention is to provide an operation control device in which an operation electrode is accommodated in a housing so as not to be affected by environmental conditions, thereby offering long service life and high reliability.

A further object of the invention is to provide an operation control device which can be readily assembled with a display device such as a fluorescent display tube or a plasma display panel, which has been used as, for example, signal level meters in tape recorders and other electronic equipment.

Still another object of the invention is to provide an operation control device assembled with a fluorescent display tube as a signal level meter in electronic equipment, in which operation conditions of the operation control device can be displayed by, for example, the fluorescent tube display itself, by a light-emitting diode display, or by a lamp display provided separately from the fluorescent display tube.

These and other objects are accomplished by an operation control device according to the present invention, which comprises an operation section having a housing made of nonconductive material and at least one operation electrode disposed within said housing and sufficiently close to one of the walls thereof so that an activation signal can be produced in response to a capacitance generated between said operation electrode and a stimulus external to said housing, a detection circuit coupled with said operation electrode for detecting said activation signal and producing an operation order signal in response to the detection of the activation signal, and control means responsive to said operation order signal for controlling said electric or electronic apparatus.

In a first illustrative embodiment, the housing is dish shaped with a flat plate being used to close an opening of the dish shaped portion, which plate is made of glass. The inside of the housing is evacuated to be in substantially a vacuum condition. At least one operation electrode is disposed on an inside surface of the housing and is made of transparent conductive material. The detection circuit is coupled to the operation electrode in a manner to respond to the capacitance produced when an external stimulus such as a finger touches the housing, particularly at a position corresponding to the operation electrode. The detection circuit includes at least one voltage comparator which compares the voltage at the operation electrode with a reference potential and produces an operation order signal when the voltage from the operation electrode indicates that an activation signal was produced by the operation electrode's electrical capacitance.

In a second illustrative embodiment, the operation section includes at least two electrodes (an operation electrode and an auxiliary electrode) which are disposed proximate to each other within a housing. The auxiliary electrode is coupled to a predetermined electric potential such as earth or ground potential and the operation electrode is coupled to a detection circuit. The detection circuit responds to the capacitance produced when an external stimulus such as a finger touches the housing, particularly at a position corresponding to a position intermediate of said two electrodes.

In a third illustrative embodiment, the operation section includes at least two electrodes (an operation electrode and an auxiliary electrode) disposed proximate to each other. The auxiliary electrode is disposed on an outside surface of a housing and coupled to a predetermined electric potential such as earth potential. The operation electrode is disposed on an inside surface of the housing and coupled to a detection circuit. The detection circuit responds to the capacitance produced when an external stimulus such as a finger touches the housing, particularly the auxiliary electrode.

In a fourth illustrative embodiment, the housing is a housing of a fluorescent display tube used, for example, for a signal level display in a tape recorder or other similar display in other equipment. The fluorescent display tube includes a conductive layer of transparent conductive material disposed on an inside surface of the housing for preventing the external environment from influencing electrons emitted in the fluorescent display tube. The operation electrode is formed at the same time as the conductive layer is formed and by the same material.

In a particular embodiment, the fluorescent display tube includes at least one indicator element, which element lights in response to the activation signal to illuminate an activated operation electrode for indicating operation conditions of the operation control device.

In another particular embodiment, the electric or electronic apparatus to be controlled is a tape recorder. A fluorescent display tube for displaying recording and/or reproducing signal levels accommodates operation electrodes therein.

According to the present invention as described above, the following benefits, among others, would be received from the present invention:

(1) an operation control device which is relatively unaffected by environmental conditions and which maintains stable operation condition for a long time;
(2) an operation control device which can be reduced in size and thickness and which may be applied to very small-size apparatus;
(3) an operation control device which does not deteriorate over prolonged periods of use; and
(4) an operation control device which eliminates malfunctions caused by the chattering phenomenon as experienced with conventional mechanical operation devices.

While the novel features of the invention are set forth with particularly in the appended claims, the invention, both as to organization and content, will be better understood and appreciated, along with other objects and features thereof, from the following detailed description taken in conjunction with the drawing, in which:

Figure 6:
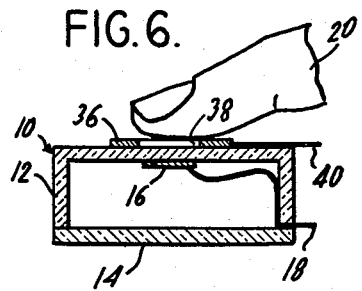
FIG. 6 is a front elevation view similar to FIG. 2 and taken along the line 6—6 of FIG. 5 and looking in the direction of the arrows.
Figure 5:
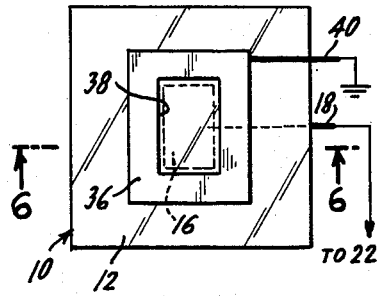
FIG. 5 is a part of a schematic circuit diagram of a third embodiment similar to FIG. 1 showing an enlarged scale plan view of an operation section.
Figure 8:
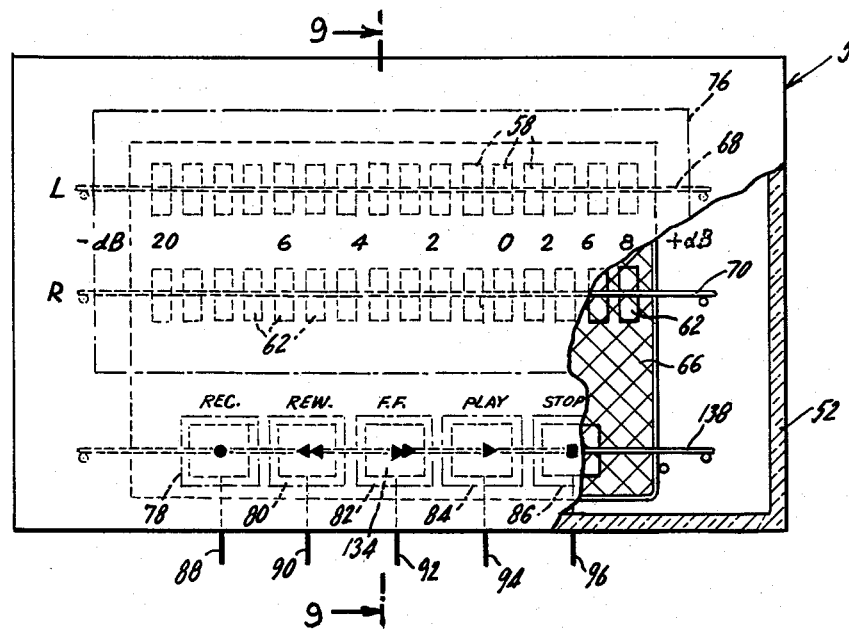
Figure 9:
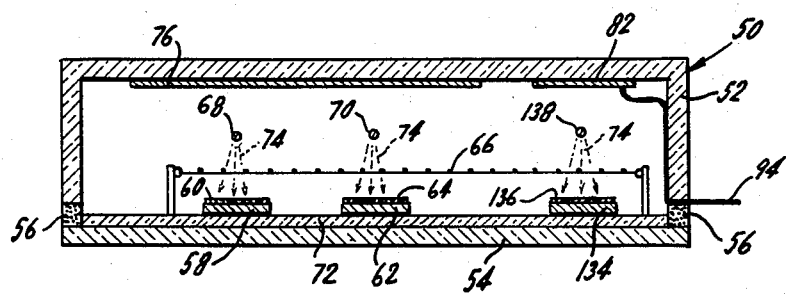
Figure 10:
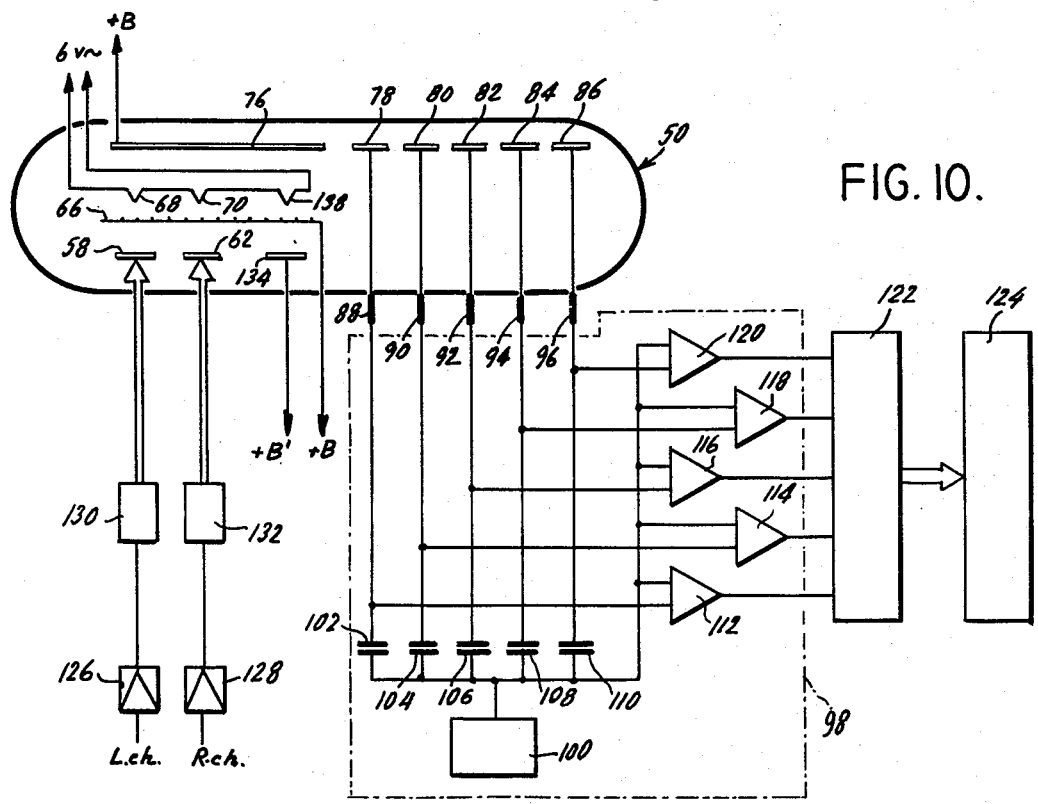

FIGS. 7(a)–(c) show possible configuration of the electrodes of the embodiment shown in FIGS. 5 and 6;

FIG. 8 is a plan view of a fluorescent display tube for use in a tape recorder as a signal level meter including an operation section of an operation control device of the fourth embodiment;

FIG. 9 is a section view taken along the line 9—9 of FIG. 8 and looking in the direction of the arrows; and FIG. 10 is a schematic circuit diagram of one example of circuitry for driving the fluorescent display tube of FIGS. 8 and 9 and the operation control device of the fourth embodiment.

Figure 2:
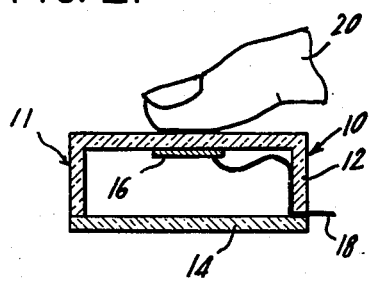
FIG. 2 is an enlarged scale front elevation section view showing an operation section of the operation control device taken along the line 2—2 of FIG. 1 and looking in the direction of the arrows.
Figure 1:
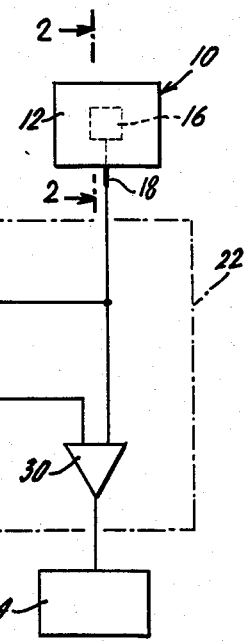
FIG. 1 is a schematic circuit diagram of one example of circuitry which may be used in an operation control device of a first embodiment of the present invention.

Referring to FIGS. 1 and 2, there is illustrated an operation section of an operation control device constructed in accordance with the embodying features of the present invention, generally designated by the reference numeral 10. As shown in FIG. 2, operation section 10 includes a housing 11 made of non-conductive material such as glass or synthetic resin. The housing 11 comprises a dish-shaped body 12 having an open side and a flat plate 14 fixed to the open side of the body 12 by a conventional bonding agent (not shown) to close the opening. Operation electrode 16 made of conductive material such as a metal plate, conductive film or conductive paint, is disposed on the bottom inside surface of the dish-shaped body 12. Lead wire 18 is connected at one end to the operation electrode 16 and the other end extends outside of the housing 11 so as to be connected to a detection circuit 22 (see FIG. 1) which will be described hereinafter. The inside of the housing 11 is evacuated to be in substantially a vacuum condition and thus, shut off from the external atmosphere so that the operation electrode 16 is not affected by and does not deteriorate from the effects of the external environment.

The above-described operation section 10 experiences a generation of capacitance when an external stimulus such as a finger 20 touches the outside surface of the dish-shaped body 12 at a location on the outside thereof corresponding to the inside location of the operation electrode 16 as shown in FIG. 2. When a finger 20 touches a part of the outside surface of the dish-shaped body 12 corresponding to the inside location of the operation electrode 16, a capacitor is formed by the operation electrode 16, dish-shaped body 12, finger 20, human body and distribution capacitance between the human body and earth, all of which are connected in series and this capacitor causes a capacitance activation signal to be produced. In this embodiment, the generation of the capacitance activation signal is detected by a detection circuit 22 (see FIG. 1), which circuit 22 produces an operation order signal in response to the detection of the activation signal, which operation order signal is applied to a control circuit which controls electric or electronic apparatus in response to the operation order signal. These circuits will be described in detail hereinafter. To make the capacitance larger, it is desirable that the dish-shaped body 12 should be made of a material having a high dielectric constant and the dish-shaped body 12 should be formed so as to be relatively thin.

FIG. 1 shows a schematic circuit diagram of one example of circuitry which may be used as an operation control device. This operation control device comprises the operation section 10, a detection circuit 22 for detecting an activation signal from the operation section 10 upon a finger 20 or other external stimuli touching the dish-shaped body 12 and producing an operation order signal in response to the detection of the activation signal, and a control circuit 24 responsive to the operation order signal for controlling electric or electronic apparatus such as tape recorders, radio receivers or microwave ovens. The detection circuit 22 comprises a pulse oscillator 26 for producing pulse voltages, a capacitor 28 and a voltage comparator 30. One of two input terminals of the comparator 30 is connected to an output terminal of the pulse oscillator 26 via the capacitor 28, while being connected to the operation electrode 16 via the lead wire 18. The other input terminal of the comparator 30 is connected to the output terminal of the pulse oscillator 26 directly so that its output pulse voltage is supplied directly thereto without any change and used as a reference voltage. The voltage comparator 30 compares a first pulse voltage (reference voltage) supplied directly from the pulse oscillator 26 with a second pulse voltage being supplied from the pulse oscillator 26 via the capacitor 28. When a finger 20 is not touching the outside surface of dish-shaped body 12, the amplitudes of the first and second pulse voltages are substantially equal and the comparator 30 does not produce its output operation order signal. However, when a finger 20 touches the outside surface of dish-shaped body 12 at a position corresponding to the interior position of the operation electrode 16, the above-mentioned capacitance is generated between the operation electrode 16 and the finger 20. The second pulse voltage is then divided by the capacitor 28 and the capacitance formed by the operation electrode 16, the dish-shaped body 12 and the human body of the owner of the finger 20. Consequently, the second pulse voltage drops from the previous value substantially equal to the first pulse voltage, while the first pulse voltage remains unchanged. The comparator 30 produces its output (high level pulse voltage) indicative of the disagreement between the two pulse voltages as an operation order signal, which signal is supplied to the control circuit 24. The control circuit 24 which comprises, for example, a logic circuit or a microprocessor, is activated in response to reception of the operation order signal for controlling operations of an electric or electronic apparatus (not shown). The control circuit 24 is conventional such as, for example, operation control logic circuits such as those used in conventional tape recorders.

Accordingly, operation of the above-described operation control device is as follows. When no finger touches the outside surface of the dish-shaped body 12, the first (reference) and second pulse voltages to be supplied to two input terminals of the comparator 30 are substantially equal and thus, the comparator 30 does not produce an operation order signal or supply the same to the control circuit 24. Therefore, the electric or electronic apparatus is not activated or controlled. When a finger 20 touches the outside surface of the dish-shaped body 12 at the outer position corresponding to the inner location of the operation electrode 16, a capacitance is generated between the operation electrode 16 and the finger 20 and the second pulse voltage drops to cause the comparator 30 to produce the operation order signal and supply the same to the control circuit 24. Therefore, the control circuit 24 controls the electric or electronic apparatus to which it is attached.

In this first embodiment, since the operation electrode 16 is accommodated in the housing 11 of operation section 10, the electrode 16 is always protected from external environmental change and thus, the operation of the operation section 10 is maintained in a stable condition.

Figure 3:
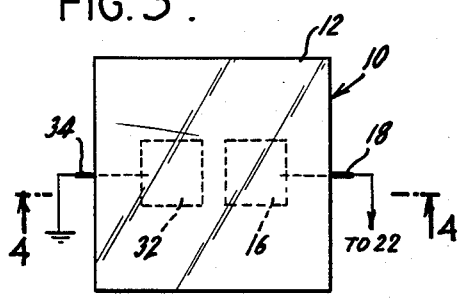
FIG. 3 is a part of a schematic circuit diagram of an operation control device of a second embodiment similar to FIG. 1 showing an enlarged scale plan view of an operation section.
Figure 4:
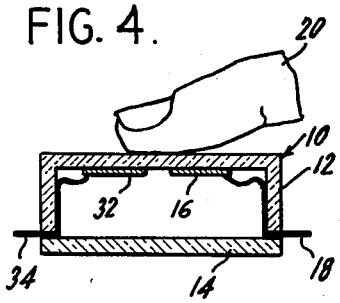
FIG. 4 is a from elevation section view similar to FIG. 2 and taken along the line 4—4 of FIG. 3 and looking in the direction of the arrows.

FIGS. 3 and 4 show another embodiment of the operation section 10. In the embodiment shown in these figures, like reference numbers denote like components with respect to those shown and disclosed in FIGS. 1 and 2. In FIG. 3, the detection circuit 22 and control circuit 24 are omitted since these circuits are the same as in FIG. 1. The operation section 10 of FIGS. 3 and 4 has an auxiliary electrode 32 which is fixed on the inside surface of the dish-shaped body 12 proximate and insulated from the operation electrode 16. The auxiliary electrode 32 may be made of the same material as the operation electrode 16. Lead wire 34 is connected at one end to the auxiliary electrode 32 and the other end is pulled out to the outside of the housing 11 of the operation section 10 to be connected to earth potential as shown in FIG. 4. When a finger 20 touches on the outside surface of the dish-shaped body 12 at a position corresponding to an intermediate position between the electrodes 16 and 32 as shown in FIG. 4, a capacitance is generated from a serial circuit of the operation electrode 16, dish-shaped body 12, finger 20, dish-shaped body 12 and auxiliary electrode 32. As a result, the capacitance between the electrodes 16 and 32 becomes larger than a capacitance generated between the electrodes 16 and 32 when no finger is put on the outside surface of the dish-shaped body 12 and the change in capacitance is supplied to the detection circuit 22 (FIG. 1) via the lead wire 18 as an activation signal. The activation signal is detected by the detection circuit 22 which then initiates the operation of the control circuit 24 in the same manner as explained in FIG. 1. Consequently, operations of the above-mentioned operation control device are as follows. When no finger touches the outside surface of the dish-shaped body 12, the first (reference) and second pulse voltages to be supplied to two input terminals of the comparator 30 are substantially equal and thus, the comparator 30 does not produce the operation order signal to the control circuit 24. Therefore, the electric or electronic apparatus is not controlled. When a finger 20 touches the outside surface of the dish-shaped body 12 at the outer position corresponding to the intermediate position between the operation electrode 16 and auxiliary electrode 32, the capacitance between the electrodes 16 and 32 is changed and then, the second pulse voltage drops to cause the comparator 30 to produce the operation order signal to the control circuit 24. Therefore, the control circuit 24 controls the electric or electronic apparatus. To make the capacitance change larger, it is desirable to arrange the auxiliary electrode 32 as near to the operation electrode 16 as possible. In addition, the dish-shaped body 12 should be made of a material having a high dielectric constant and the body 12 should be thin. In this second embodiment, since both the operation electrode 16 and auxiliary electrode 32 are accommodated in the housing 11 of the operation section 10, electric connection between the electrodes due to moisture is prevented and thus, the operation of the operation section 10 is maintained in stable condition.

FIGS. 5 and 6 show further embodiments of the operation section 10. In these figures, like reference numbers denote like components in FIGS. 1 and 2. In FIG. 5, the detection circuit 22 and control circuit 24 are omitted since these circuits are the same as in FIG. 1. The operation section 10 of FIGS. 5 and 6 has an auxiliary electrode 36 which is made of a metal sheet and attached by a binding agent on the outside surface of the dish-shaped body 12 at an outside position corresponding to the inside position of the operation electrode 16 fixed on the inside surface of the dish-shaped body 12. The auxiliary electrode 36 has an aperture 38 in the center thereof. Alternatively, the auxiliary electrode 36 may be made of the same material as the operation electrode 16, such as conductive paint. Lead wire 40 is connected at one end to the auxiliary electrode 36 and at the other end to earth potential as shown in FIG. 5. Alternatively, the lead wire 40 may be replaced by a contact piece formed by elongating a part of the auxiliary electrode 36. When a finger 20 touches the aperture 38 part of the auxiliary electrode 36 as shown in FIG. 6, a capacitance is generated by the operation electrode 16, dish-shaped body 12, finger 20 and auxiliary electrode 36. As a result, the capacitance between the electrodes 16 and 36 becomes larger than the capacitance generated between the electrodes 16 and 36 when no finger is put on the auxiliary electrode 36. If the aperture 38 of the auxiliary electrode 36 is formed with a size equal to or smaller than a finger tip, a part of a finger tip will come into contact with the auxiliary electrode 36, yielding a larger capacitance than a capacitance without the auxiliary electrode in FIG. 1. The larger capacitance is supplied to the detection circuit 22 (FIG. 1) via the lead wire 18 as an activation signal. The activation signal is detected by the detection circuit 22 which then initiates the operation of the control circuit 24 in the same manner as explained in FIG. 1. Consequently, operations of the above-mentioned operation control device are as follows. When no finger touches the auxiliary electrode 36, the first (reference) and second pulse voltages to be supplied to two input terminals of the comparator 30 are substantially equal and thus, the comparator does not produce the operation order signal to the control circuit 24. Therefore, the electric or electronic apparatus is not controlled. When a finger 20 touches the auxiliary electrode 36 at its aperture 38, the capacitance between the electrodes 16 and 36 is changed and then, the second pulse voltage drops to cause the comparator 30 to produce the operation order signal to the control circuit 24. Therefore, the control circuit 24 controls the electric or electronic apparatus.

In this third embodiment, the size of the aperture 38 of the auxiliary electrode 36 may be slightly smaller than the operation electrode 16 to obtain a still larger capacitance upon a finger touch. In the aperture 38, for example, crossed mesh or more fine mesh may be formed as part of said auxiliary electrode 36.

Figure 7:
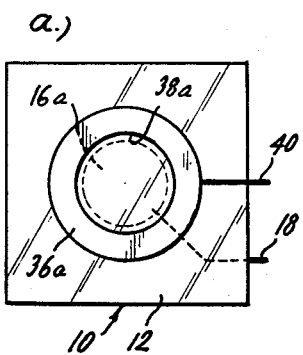
Figure 7:
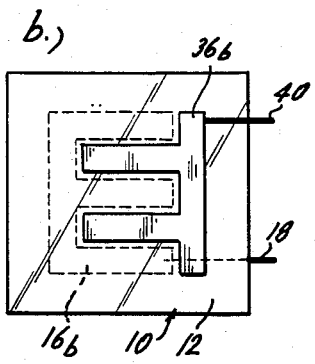
Figure 7:
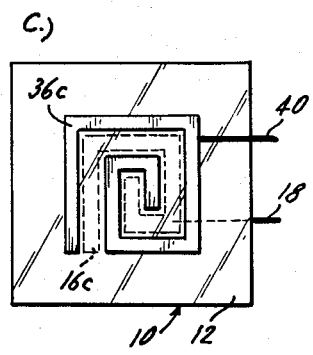

The shape of the operation electrode 16 and shape of the auxiliary electrodes 32, 36 and shape of the aperture 38 are not limited to the shape shown in FIGS. 1-6, but they may be formed, for example, in such shapes as shown in FIG. 7. FIG. 7(a) shows the auxiliary electrode 36a formed in a circular ring shape, with the operation electrode 16a concentrically arranged at its center; FIG. 7(b) shows the electrodes 36b and 16b formed in comb shape to be fit in each other, and FIG. 7(c) shows the electrodes 36c and 16c placed in a convolute arrangement. In this way, by choosing the shape and arranging relation of the operation electrode 16 and the auxiliary electrode 36 or 32, the capacitance change which will occur when a finger touches on the outside surface of the dish-shaped body 12 may be controlled, and the detection area may be increased or decreased.

In the above-mentioned embodiments, if the dish-shaped body 12 is made of transparent glass, it may be desirable that the electrodes 16, 32 are made of colored conductive material, which makes it very easy for a user to distinguish the position of the electrodes. If the electrodes are made of non-colored transparent material, it may be desirable that marks to indicate the position of the electrode be printed or engraved on the dish-shaped body 12 at an outside position corresponding to the inside position of the operation electrode 16 (FIG. 1) or the position between the operation electrode 16 and auxiliary electrode 32 (FIG. 3) or a periphery portion of the electrode (FIGS. 1 and 3). In the third embodiment, the auxiliary electrode 36 may be made of colored material or the mark may be printed or engraved on an area of the aperture 38.

Though in the above-mentioned embodiments, operation sections are explained as independent elements, it will be easily understood that the operation sections are readily assembled with another element having a housing made of non-conductive material such as fluorescent display tubes and plasma display panels which have been used, for example, in tape recorders as signal level meters or tape counters for indicating transporting lengths of magnetic tapes.

From this point of view, FIGS. 8-10 show still another embodiment of the present invention. In this embodiment, an operation section of an operation control device is built in a fluorescent display tube for use in a tape recorder as a signal level meter. Recently, fluorescent display tubes have been employed in various apparatus such as electronic calculators, tape recorders, radio receivers and microwave ovens and used as, for example, display panels for displaying calculation results, tape counters, signal level meters, clocks and timers. However, fluorescent display tubes have been used only for display function, and the operation sections for the various apparatus referred to above have not been mounted together with the display tubes. In the embodiment of FIGS. 8-10, the fluorescent display tube and the operation section are mounted together.

Referring to FIG. 8, there is illustrated a fluorescent display tube for use as a signal level meter in a tape recorder having the same type of operation section as that shown in FIGS. 1 and 2. The fluorescent display tube 50 includes a housing which comprises a dish-shaped transparent glass body 52 and a flat glass plate 54 fixed to the dish-shaped glass body 52 by frit glass 56 as a binding agent to close an opening of the dish-shaped body 52. The inside of the housing of the fluorescent display tube 50 is evacuated to be in a substantially vacuum condition or may be kept in the state of having low humidity air or inert gas and thereby shut off from external atmosphere. The display section of the fluorescent display tube is conventional and well known to skilled persons in the art. The display section includes a first series of anode electrodes 58 having a fluorescent agent 60 such as phosphor thereon, a second series of anode electrodes 62 having a fluorescent agent 64 such as phosphor thereon, mesh-type grid electrode 66 and filaments 68, 70. The anode electrodes 58, 62 are fixed on an insulation plate 72, which plate 72 is fixed on the glass plate 54, and used for displaying the amplitude of left and right recording/reproducing signals (stereo signal), respectively. The display section of the fluorescent display tube is also well known. Electrons 74 emitted from heated filaments 68, 70 are accelerated by the grid electrode 66 to come into collision with electrodes 58, 62. Then, fluorescent agents 60, 64 of the anode electrodes 58, 62 are energized and emit light. The light can be seen through the dish-shaped glass body 52. The plurality of anode electrodes 58 are disposed side-by-side along a line and insulated from each other. The anode electrodes 62 are likewise disposed side-by-side along a line and insulated from each other. The number of anode electrodes to be applied with a positive voltage, namely, anode electrodes to emit light, is varied in response to the level of the input signal. Therefore, a bar-graph display, like a thermometer display, is obtained.

On the inside surface of the dish-shaped body 52, a transparent electrode 76 is disposed and a positive potential relative to the filaments 68, 70 is applied thereto. Due to the transparent electrode 76, electrons emitted from the filaments 68, 70 are not affected even when the outside surface of the dish-shaped body 52 is touched by a finger or even when the surface is charged with static electricity.

Turning now to a description of the operation section, operation electrodes 78-86 are fixed to the inside surface of the dish-shaped body 52. The operation electrodes 78-86 are made of the same material as the transparent electrode 76 and formed at the same time that the transparent electrode 76 is formed. The material is, for example, tin oxide. For example, the transparent electrode 76 is formed by heating tin chloride solution applied on the inside surface of the dish-shaped body 52. Then, the transparent electrode 76 is tin oxide which is transparent conductive film. By this same process, the operation electrodes 78-86 are formed. The operation electrodes 78-86 are connected to lead wires 88-96. As is apparent from the foregoing, operation electrodes 78-86 form the same type of operation sections as shown in FIG. 1 and, thus, functions the same as explained in FIGS. 1, 2. If a finger touches the outside surface of the dish-shaped body 52 at a position corresponding to respective operation electrodes 78-86, the activated operation electrode generates a capacitance. This generation of capacitance is detected by a detection circuit and activates control operation of a control circuit. In FIGS. 8 and 9, if the dish-shaped body 52 is exposed directly to the outside, the dish-shaped body 52 may be formed of a colored transparent glass, so that the components accommodated in the fluorescent display tube such as the grid electrode 66 and filaments 68, 70 are not visible from the outside.

FIG. 10 shows a schematic circuit diagram of one example of circuitry which is used as an operation control device assembled with a signal level display device (fluorescent display tube) of a tape recorder. In FIG. 10, like reference numbers show like components in FIGS. 8 and 9. The operation electrodes 78-86 are connected to a detection circuit 98 via lead wires 88-96. The detection circuit 98 includes a pulse oscillator 100 for producing pulse voltages, capacitors 102-110 and voltage comparators 112-120. Each operation electrode 78-86 is connected to an output terminal of the pulse oscillator 100 via each lead wire 88-96 and each capacitor 102-110. Each junction of each capacitor and each lead wire is respectively connected to one input terminal of each comparator 112-120. The other input terminal of each comparator is connected directly to the output terminal of the pulse oscillator 100. The above-described circuit is the same kind of circuit as that in FIG. 1. Consequently, each comparator 112-120 receives two kinds of input signal: a first pulse voltage (reference voltage) directly from the pulse oscillator 100; and a second pulse voltage from the pulse oscillator 100 via each capacitor. If the amplitudes of said two pulse voltages are substantially equal (when no finger touches the dish-shaped body 52), none of the comparators 112-120 produces its output (operation order signal). But, if the amplitudes are different from each other (when a finger touches a part of the dish-shaped body 52), the corresponding comparator produces a high-level output signal. Output terminals of the comparators 112-120 are connected to a control circuit 122, which circuit comprises, for example, a logic circuit or a microcomputer which control a tape recorder section 124 including, for example, a magnetic tape transporting mechanism, a recording circuit and a reproducing circuit. If one of the comparators 112-120 produces a high-level output signal (operation order signal) in response to a finger touch on the dish-shaped body 52 at a position corresponding to one of the operation electrodes 78-86, the control circuit 122 applies an operation control signal to the tape recorder section 124 and then, the tape recorder section 124 carries out an operation corresponding to the activated operation electrode.

For example, as shown in FIG. 8, the operation electrodes 78-86 may have the following functions respectively: (1) the operation electrode 78/"rec" (recording) function for activating a recording circuit and deactivating a reproducing circuit in the tape recorder section 124; (2) the operation electrode 80/"rew" (fast rewind) function for transporting a magnetic tape in reverse direction at high speed; (3) the operation electrode 82/"ff" (fast forward) function for transporting a magnetic tape in forward direction at high speed; (4) the operation electrode 84/"play" function for transporting a magnetic tape in forward direction at constant low speed and for activating a reproducing circuit; and (5) the operation electrode 86/"stop" function for terminating all operations of the tape recorder section 124. Marks for indicating operation functions of each operation electrode are printed or engraved on the dish-shaped body 52. The marks include characters such as "rec", "rew", "ff", "play" and "stop" and symbols such as square and triangle, as shown in FIG. 8. The characters are printed on the dish-shaped body 52 at a position corresponding to a periphery of each operation electrode and the symbols are printed on the dish-shaped body 52 at a position corresponding to a center of each operation electrode.

For example, when a user wants to reproduce a recording of a magnetic tape, the outside surface of the dish-shaped body 52 is first touched by a finger at a position corresponding to the "play" operation electrode 84. By this operation, a capacitance is generated between the finger and the operation electrode 84 through an intermediary of the dish-shaped body 52. This generation of capacitance is detected by the detection circuit 98. As described above, each comparator has two kinds of input voltages, the first pulse voltage (reference voltage) directly from the pulse oscillator 100 without any change and the second pulse voltage from the pulse oscillator 100 via each capacitor. A capacitance is generated on the operation electrode 84 when a finger touches the body 52 and the second pulse voltage drops. By this reduction of the second pulse voltage, the comparator 118 produces high-level output signal, indicative of unequal input signal to comparator 118, which is "play" operation order signal. After receiving the "play" order signal, the control circuit 122 produces a "play" control signal to the tape recorder section 124, which section operates so that the tape transportation mechanism transports a magnetic tape at a constant low speed and the reproducing circuit operates to reproduce the recorded signal from a magnetic tape.

Similarly, when a user wants to record a signal to be recorded on a magnetic tape, the outside surface of the dish-shaped body 52 is touched at positions corresponding to the "play" operation electrode 84 and the "record" operation electrode 78. By this operation, comparators 118 and 112 produce high-level output signal and the tape recorder section 124 operates so that the tape transportation mechanism transports a magnetic tape at a constant low speed and the recording circuit operates to record a signal onto the magnetic tape.

Similarly, when the "rew" operation electrode 80 or "ff" operation electrode 84 is activated, a magnetic tape is transported in a reverse or forward direction at a high speed without reproducing or recording. When the "stop" operation electrode 86 is activated, the entire operation of the tape recorder section stops. A "pause" operation electrode may be provided for stopping a tape transportation temporarily.

As stated above, the fluorescent display tube 50 displays levels of reproducing and recording signals. In FIG. 10, amplifiers 126, 128 amplify left channel reproducing or recording signal and the right channel reproducing or recording signal respectively. These left and right channel signals form a stereophonic signal. Display drive circuit 130, 132 converts the output signals of the amplifier 126, 128, for example, into a plurality of output voltages, namely digital signals, corresponding to the levels of the output signals of the amplifier 126, 128, and supply the voltages to pertinent segments of the anode electrodes 58, 62 respectively. As a result, light-emission occurs on the areas of the anode electrodes 58, 62 as a bar-graph, the length of which corresponds to the input signal levels.

In the above fourth embodiment of FIGS. 8-10, operation electrodes 78-86 would be replaced by the electrodes shown in FIGS. 3, 4 or 5, 6, or FIG. 7. For example, a plurality of auxiliary electrodes can be disposed on the inside surface of the dish-shaped body 52, proximate the operation electrodes 78-86. The auxiliary electrodes are all connected to earth potential. Alternatively, an auxiliary electrode having a plurality of apertures may be disposed on the outside surface of the dish-shaped body 52. The apertures may face the operation electrodes 78-86. The auxiliary electrode is connected to earth potential via a contact piece formed by elongating a part of the auxiliary electrode.

Furthermore, it is possible to illuminate the operation electrodes when the electrode is energized to inform a user of an activated operation mode. For example, as shown in FIG. 9, anode electrodes 134 with fluorescent agents 136 are disposed on the insulation plate 72. The grid electrode 66 is extended over the anode electrodes 134 and another filament 138 is provided above the anode electrodes 134. If one of the operation electrodes is activated, and then one of anode electrodes 134 corresponding to the activated operation electrode is supplied with +B voltage (FIG. 10) through a drive circuit, such as the control circuit 122, the energized operation electrode 134 is illuminated by light emitted from the corresponding anode electrode 134. If the anode electrodes 134, particularly the fluorescent agent thereon, are formed in the configuration of letters or figures, the operation mode of the apparatus will be more clearly indicated. Such indication means using anode electrodes 134 could be replaced by, for example, light-emitting diodes or lamps which may be installed separately from the fluorescent display tube 50.

In the above-described fourth embodiment, display control is carried out only by changing the voltage of anode electrodes 58, 62. This control method is generally called a static drive method. On the other hand, a dynamic drive method for driving a fluorescent display tube may also be used. In this method, for example, the grid electrode 66 of FIG. 10 is divided into two parts corresponding to two kinds of anode electrodes 58, 62. A positive pulse voltage is alternately applied to the grid electrode. The respective segments of the anode electrodes 58, 62 are connected in common. Then, through a time divided operation of a drive circuit, which circuit is disposed in place of circuits 130, 132 as a common circuit, switching between the amplifiers 126 and 128 is made, thereby alternately emitting light from the anode electrodes 58 and 62. Thus, the structure of the device is simplified by adopting this dynamic drive method. In this case, the pulse generator 100 and capacitors 102–110 of FIG. 10 may be omitted by utilizing distribution capacitances between the operation electrode 78–86 and the two grid electrode parts. Since there exist distribution capacitances between the grid electrode parts and respective operation electrodes, and a positive pulse voltage is supplied to the grid electrode parts alternately, the same function as derived by the pulse oscillator 100 and capacitors 102–110 may be obtained.

Furthermore, the above-described fluorescent display tube could be replaced by another display device such as plasma display panel and discharge display tube. Therefore, the operation electrode could be accommodated in various types of display device.

Furthermore, this operation device is not limited to use of tape recorders, but can be used, for example, as a device for making a channel switching operation for radios or TV receivers, as a device for operating an electronic digital attenuator in which resistance values are automatically varied upon activating an operation electrode (up-down switch), and as a device for setting or adjusting time information in a clock or timer. Therefore, the operation device of the present invention would be used in various kinds of electric or electronic apparatus.

While specific embodiments of the invention have been illustrated and described herein, it is realized that other modifications and changes, for example, changing the shape and number of operation and auxiliary electrodes or omitting the pulse oscillator and capacitors in the case of dynamic drive of the fluorescent display tube, will occur to those skilled in the art. It is therefore to be understood that the appended claims are intended to cover all modifications and changes as fall within the true spirit and scope of the invention.

What is claimed is:

1. A display apparatus having an operational control for use in an electric or electronic apparatus, comprising:

a display device having a housing made of non-conductive material for displaying an indication that an operating switch is actuated and for displaying an indication that said electric or electronic apparatus is in operation, said operating switch including at least one operation electrode disposed within said housing so that an activation signal can be produced in response to a capacitor produced between said operation electrode and a stimulus external to said housing;

a first display disposed within said housing for indicating that the operating switch is activated;

a second display element disposed within said housing for indicating that said apparatus is in operation, said operation electrode, first display element and second display element being enclosed within the housing;

a detection circuit coupled to said operation electrode for detecting said activation signal and producing an operation order signal in response to the detection of the activation signal; and control means responsive to said operation order signal for controlling said electric or electronic apparatus;

whereby when said operation switch is actuated, said first display element indicates that the operating switch is actuated, and when said apparatus operates in response to the actuation of the operation switch, said second display element indicates that the apparatus is in operation.

2. The operation control device according to claim 1, wherein said housing is dish-shaped and has an opening closed by a flat plate.

3. The operation control device according to claim 1, wherein said housing is made of glass.

4. The operation control device according to claim 1, wherein the inside of said housing is evacuated to be in substantially a vacuum condition.

5. The operation control device according to claim 1, wherein said operation electrode is disposed on an inside surface of said housing.

6. The operation control device according to claim 1, wherein said operation electrode is made of transparent conductive material.

7. The operation control device according to claim 1, wherein said detection circuit includes at least one voltage comparator which compares the voltage at the operation electrode with a reference potential and produces said operation order signal when the voltage from the operation electrode indicates that said activation signal was produced.

8. The operation control device according to claim 1, wherein said housing is a housing of a fluorescent display tube.

9. The operation control device according to claim 8, wherein said fluorescent display tube includes a conductive layer made of transparent conductive material disposed on the inside surface of said housing for preventing the external environment from influencing electrons emitted in the fluorescent display tube, said operation electrode being formed of the same transparent conductive material as said conductive layer.

10. A display apparatus having an operational control for use in an electric or electronic apparatus, comprising:

a fluorescent display tube having a housing made of non-conductive material for displaying an indication that an operation switch is actuated and for displaying an indication that said electric or electronic apparatus is in operation, said operation switch including at least one operation electrode disposed on the inside surface of said housing so that an activation signal can be produced in response to a capacitor.

11. The display apparatus of claim 10, wherein said electric or electronic apparatus is a tape recorder.

12. A display apparatus having an operational control for use in a tape recorder, comprising:

a display device having a housing made of non-conductive material for displaying an indication that an operating switch is actuated and for displaying a recording/reproducing signal level when the tape recorder is in operation, said operation switch including at least one operation electrode disposed within said housing so that an activation signal can be produced in response to a capacitor generated between said operation electrode and a stimulus external to said housing;

a first display element disposed within the housing for displaying an indication that the operating switch is actuated;

a second display element disposed within the housing for displaying the recording/reproducing signal level, said operation electrode, first display element and second display element being enclosed within the housing;

a detection circuit coupled to said operation electrode for detecting said activation signal and producing an operation order signal in response to the detection of the activation signal; and control means responsive to said operation order signal for controlling said tape recorder, whereby when said operation switch is actuated, said first display element indicates that the operating switch is actuated, and when said apparatus operates in response to the actuation of the operation switch, said second display element indicates the recording/reproducing signal level.

* * * * *